United States Patent [19]
Gaultier et al.

[11] Patent Number: 6,138,220
[45] Date of Patent: *Oct. 24, 2000

[54] METHOD AND DEVICE FOR THE PREDICTIVE READING OF A MEMORY

[75] Inventors: Jean-Marie Gaultier, Lotissement La Pinède; Gérard Silvestre De Ferron, Les Croutes, both of France

[73] Assignee: SGS-Thomson Microelectronics S.A., Gentilly, France

[*] Notice: This patent issued on a continued prosecution application filed under 37 CFR 1.53(d), and is subject to the twenty year patent term provisions of 35 U.S.C. 154(a)(2).

[21] Appl. No.: 08/991,693

[22] Filed: Dec. 16, 1997

[30] Foreign Application Priority Data

Dec. 17, 1996 [FR] France ................................. 96 15515

[51] Int. Cl.$^7$ .................................................. G06F 12/00
[52] U.S. Cl. .......................... 711/163; 711/154; 711/137
[58] Field of Search .................................. 711/1, 3, 137, 711/154, 163, 207; 712/207, 237; 713/200; 380/49

[56] References Cited

U.S. PATENT DOCUMENTS

| | | | |
|---|---|---|---|
| 4,691,277 | 9/1987 | Kronstadt et al. | 711/213 |
| 4,864,533 | 9/1989 | Hanada | 710/26 |
| 4,901,227 | 2/1990 | Nomura et al. | 364/200 |
| 5,404,467 | 4/1995 | Saba et al. | 712/207 |
| 5,602,781 | 2/1997 | Isobe | 365/189.05 |
| 5,748,558 | 5/1998 | Suzuki | 365/233 |

FOREIGN PATENT DOCUMENTS

| 0 315 194 | 5/1989 | European Pat. Off. | G11C 8/00 |
|---|---|---|---|
| 0 333 231 | 9/1989 | European Pat. Off. | G11C 8/00 |

OTHER PUBLICATIONS

French Search Report from French Patent Application 96 15515, filed Dec. 17, 1996.

*Primary Examiner*—Tuan V. Thai
*Attorney, Agent, or Firm*—Wolf, Greenfield & Sacks, P.C.; James H. Morris; Theodore E. Galanthay

[57] ABSTRACT

An apparatus and method for reading of a memory associated with a central processing unit that does not permit a fraudulent individual to discover the addressing codes of the memory corresponding to the performance of a particular wherein the successive codes for the addressing of the memory are deduced from one another according to a function of prediction defined by the programmer. These addressing codes are verified by the addressing circuits of the memory by means of a computation and comparison procedure that know the prediction function.

5 Claims, 2 Drawing Sheets

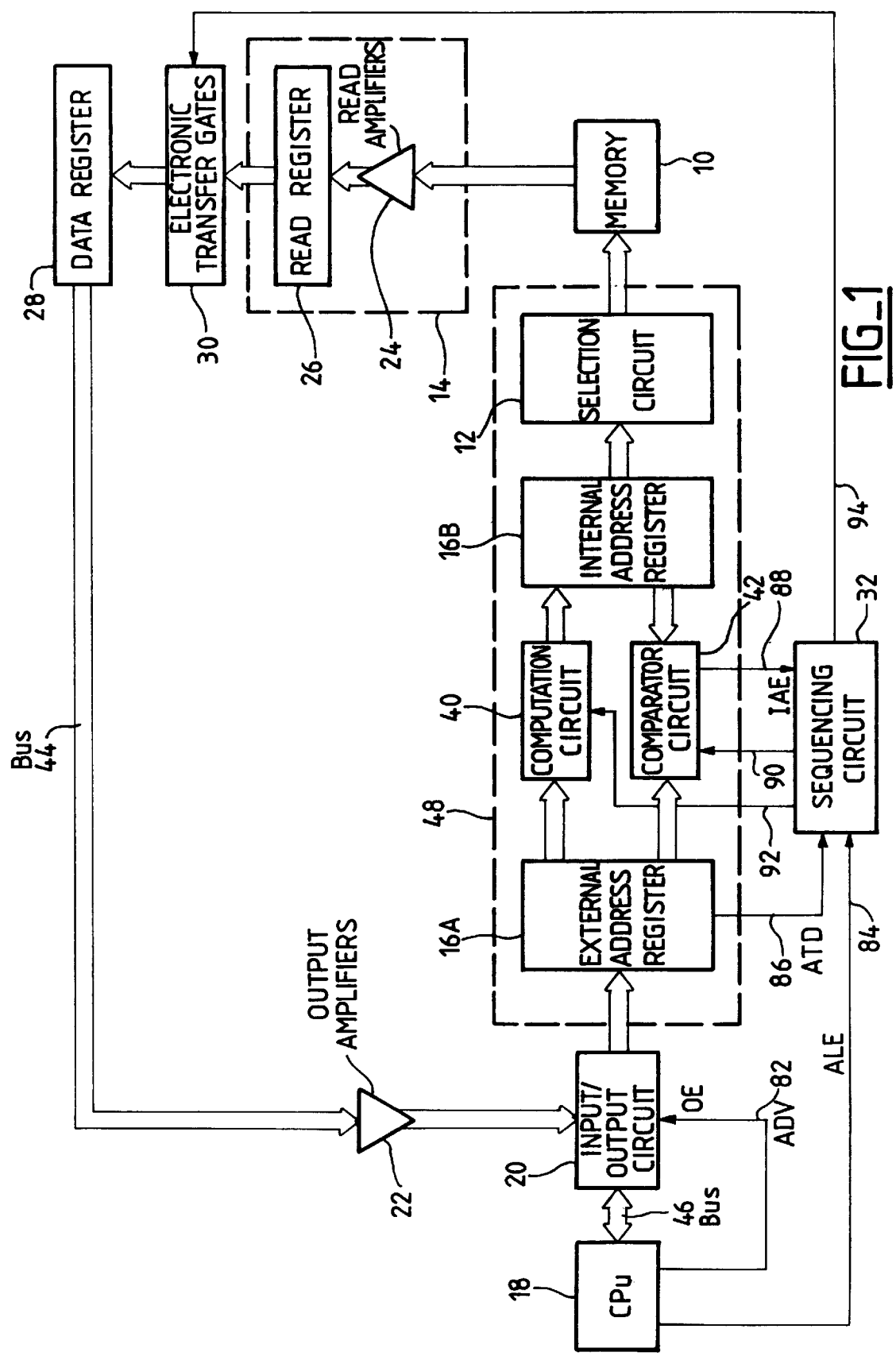
FIG_1

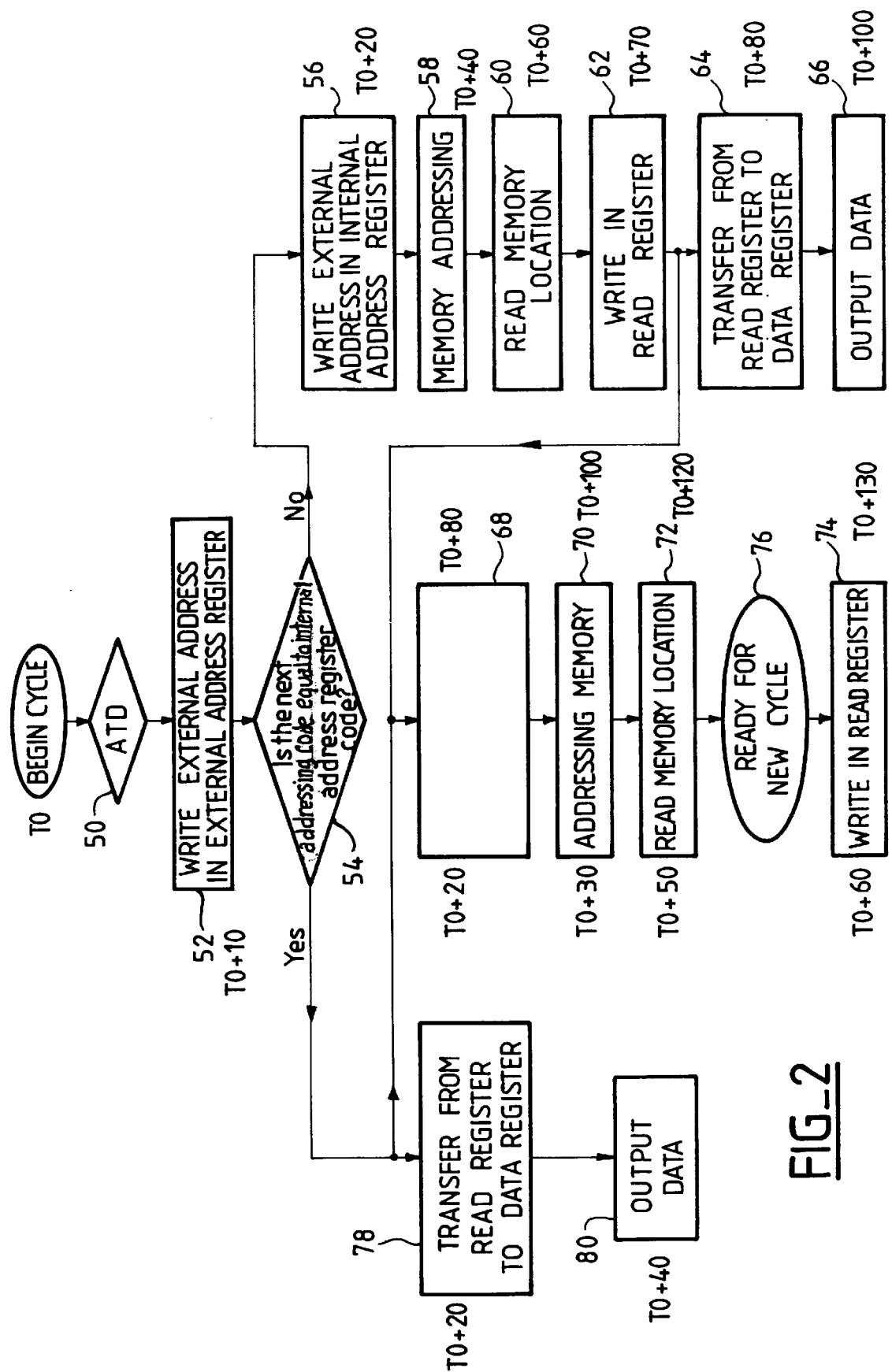
FIG_2

METHOD AND DEVICE FOR THE PREDICTIVE READING OF A MEMORY

BACKGROUND OF THE INVENTION

1. Field of the Invention

The invention relates to the memories of the central processing units of microcomputers and more particularly to a method and device for the predictive reading of a memory so as to improve the security of the microcomputer against fraud as well as the performance characteristics of the memory by increasing the data output speed.

2. Discussion of the Related Art

Items of data contained in a memory are read by means of addresses or addressing codes that are provided successively to the addressing or selection circuits of the memory by the central processing unit of the microprocessor or microcontroller, each addressing code corresponding to a piece of data that is then processed by the central processing unit according to the instruction being executed. In this mode of addressing and reading the memory, the pieces of data contained in the memory are read as and when the addressing codes arrive, the addressing code of the next piece of data to be processed being provided only after the transfer of the previous piece of data into the central processing unit.

This read mode leads to idle time during reading of the memory and therefore results in a time delay. This time delay is detrimental to the speed of computation of the central processing unit.

In certain applications of microcomputers, to improve security against fraud, for example to prevent the user's access code from being discovered by a fraudulent individual, it would be desirable to complicate the task of this fraudulent individual by ensuring that he cannot discover this access code through the analysis of the addressing codes given by the central processing unit.

In other applications of microcomputers such as in mobile telephones, the user or subscriber has access to various services, the number of which depends on the amount of his or her subscription. To this end, the microcomputer is programmed for all the services, but access to some of them will depend on an access code, for example a code A for the basic services corresponding to a certain number of programs, a code B for the basic services plus a certain number of special services corresponding to other programs, a code C for the basic services plus other services corresponding to yet other programs and so on.

In an application of this kind, it is important that a fraudulent individual should be incapable of discovering the meanings of the codes A, B and C. Knowledge of these codes would place him in a position to subscribe only to the basic services (code A) which are the least expensive ones, and to enjoy the additional services of the codes B and C which are the costliest services.

SUMMARY OF THE INVENTION

In one embodiment of the invention, the problem has been overcome in the case of the performance of an instruction that uses the pieces of data contained at consecutive addresses of the memory. To this end, it is planned firstly to record the data read in a so-called data register to free a read register designed to store the signals read and, secondly, to increment the addressing code by one unit so as to read the memory at the next address and record the signals read in the read register. This new piece of data is taken into account by the central processing unit only if the incremented address is confirmed by the central processing unit. This new piece of data is therefore available at an instant prior to the instant of appearance of the new addressing code which will be given by the central processing unit in read mode according to the prior art. The result therefore is an incremental gain in memory access time with each instruction, this incremental gain being a significant value since the program includes numerous instructions that select consecutive addresses of the memory.

One object of the invention therefore is to implement a method for the reading of a memory associated with a central processing unit that does not permit a fraudulent individual to discover the addressing codes of the memory corresponding to the performance of a particular code. To achieve this object, one embodiment of the invention proposes that the successive addressing codes of the memory should be deduced from one another according to a defined relationship or function of prediction and that this function should be verified by the addressing circuits of the memory. Thus, should the fraudulent individual furnish an addressing code that does not correspond to the expected prediction function, the code will lead to the reading of an erroneous piece of data and hence to a malfunction or even to an impossibility of the functioning of the system.

The implementation of this method leads to the modification of the read circuits of the memory. Thus, a first address register containing the addressing code of the memory provided by the central processing unit is backed up by a second register in which there is recorded an addressing code computed by a computation circuit on the basis of the code contained in the first address register, this computation being done according to a function that has been defined by the programmer of the central processing unit.

This addressing code, which is computed or predicted according to the function, is used to read the corresponding cells of the memory.

When the next addressing code is provided by the central processing unit to the first addressing register, the next addressing mode is compared with the computed addressing code which is contained in the second address register.

If there is identity, it means that the addressing code computed is in accordance with the function and that the piece of data that has just been read may be taken into account by the central processing unit.

If there is no identity, the computed addressing code is taken to be false and the piece of data corresponding to it is not taken into account. The addressing code that is then used is the one that has been just provided by the central processing unit and it is the corresponding piece of data read in the memory that is taken into account by the central processing unit.

In this case, if the addressing code that is given by the central processing unit is accurate and therefore corresponds to a planned running of the program, the system continues to work normally. On the contrary, if the addressing code is a false code introduced by a fraudulent individual, the result is a wrong piece of data and hence a malfunctioning of the system.

Apart from the modification of the addressing circuits, this new method leads to the modification, if necessary, of the read circuits. These read circuits then include a first register called a read register which, in every respect, is similar to the register used in present-day memories and a second register called a data register to store the contents of the read register and make them available for the recording of pieces of information read by means of the addressing code computed and contained in the second address register.

A second address register of this kind makes it furthermore possible to reduce the memory access time of the central processing unit when the successive addressing codes follow the prediction law, for the reading is done before the arrival of the addressing code given by the central processing unit.

More specifically, the invention relates to a method for the reading of a memory of a central processing unit of a microcomputer with which there are associated circuits for the addressing of the cells of the memory, comprising at least one first address register to receive an addressing code from the central processing unit, and circuits for the reading of the signals read in the cells of the memory selected by the addressing circuits, comprising at least one read register in which there are recorded, in binary form, the signals read wherein the method comprises the following steps:

a) selecting a prediction function determining an addressing code of the memory from the previous addressing code, and b) preparing the programs of instructions in taking account of the prediction function chosen at step a) to define successive addressing codes.

The prediction function of the addressing code may be a function not of the preceding addressing code alone but of several preceding addressing codes.

For the reading of the memory, the method is then the following:

c) transferring an addressing code from the central unit to the first address register of the addressing circuits of the memory;

d) comparing the addressing code contained in the first address register with the code contained in a second address register;

e) reading the memory at the address contained in the first address register if there is no identity of the codes compared;

f) reading the memory at the address contained in the second address register if there is an identity of the codes compared;

g) computing the next addressing code from the previous addressing code by the application of the prediction function defined in step a);

h) recording the addressing code computed by the step g) in the second addressing register; and i) returning to step c).

To increase the speed of reading of the memory 10, an intermediate step h') is executed between steps h) and i), for reading the memory at the address contained in the second address register.

Furthermore, the piece of data read in the memory by step h') is transferred to the central processing unit only if the comparison of step d) indicates identity.

To implement the method of reading of the memory according to the invention, the addressing and reading circuits of the memory must be modified and added to.

A device of this kind is characterized in that the addressing circuits comprise a second addressing register, and a computation circuit connected between the first and second addressing registers to compute the next addressing code from the previous addressing code contained in the first address register. The device further comprises a comparator circuit connected between the first address register and second address register to compare the addressing codes contained in the first and second address registers and a sequencing circuit to prepare the sequential control signals of the address registers, the computation circuit and the comparator circuit wherein said sequencing circuit comprising a clock circuit and logic circuits to carry out the steps of the method defined here above.

A device of this kind is also characterized in that the read circuits furthermore comprise a second read register called a data register, and a logic transfer register that can connect the output terminals of the first read register to the input terminals of the second read register, wherein the logic transfer circuit being controlled by the signals given by the sequencing circuit so as to transfer the contents of the first read register into the second read register as soon as the second read register contains the addressing code.

BRIEF DESCRIPTION OF THE DRAWINGS

The invention will shall now be described with reference to a particular embodiment, the description being made with reference to the appended drawings, of which:

FIG. 1 is a drawing of a device for the predictive reading of a memory according to one embodiment of the invention.

FIG. 2 is a graph showing a sequencing of the operation for the predictive reading of a memory according to one embodiment of the invention.

DETAILED DESCRIPTION

In a known way, with a memory 10, there are associated selection circuits 12 that enable the selection of the memory cells or locations and read circuits 14 that enable the "collecting" of the signals read in the memory cells in the form of pieces of binary information or data. The addresses of the memory cells or compartments are given to the selection circuits 12 by an address register called an external address register 16A which receives them from a central processing unit 18 by means of an input/output circuit 20 and a two-way bus 46.

The external address register 16A and the selection circuits 12 constitute the memory addressing circuits 48.

This input/output circuit 20 furthermore receives the information or data read in the memory 10 by means of the read circuits 14 and output amplifiers 22 and a one-way bus 44. The input/output circuit 20 is activated by a signal OE given by the central processing unit 18 on a conductor 82.

The read circuits 14 include read amplifiers 24 which amplify the signals read in the selected memory cells and a read register 26 that records or stores the signals read in binary form.

With the memory 10, there are also associated recording circuits that shall not be described herein for the invention relates only to the reading of the memory.

To implement the predictive reading method according to the invention, the addressing circuits 48 and the read circuits 14 must be added to and modified.

Thus, with the external address register 16A there must be associated:

an internal address register 16B to record the addressing code that will be used for the selection, a computation circuit 40 to compute the next addressing code from the previous addressing code contained in the external address register 16A, a comparator circuit 42 to compare the addressing codes contained in the external register 16A and internal register 16B, and a sequencing circuit 32 to prepare the sequential control signals.

The internal address register 16B has its output terminals which are connected to the selection circuits 12 of the memory and its input terminals which are connected to the output terminals of the external address register 16A by means, firstly, of the computation circuit 40 and, secondly, of the comparator circuit 42.

With the read register 26, there is associated an additional register known as a data register 28 that is connected between the read register 26 and the output amplifiers. The input terminals of the data register 28 are connected to the output terminals of the read register 26 by means of electronic circuits 30 comprising electronic transfer gates. The output terminals of the data register 28 are connected to the input/output circuits 20 by means of output amplifiers 22 and the one-way bus 44.

The sequencing circuit 32 is connected to the central processing unit 18, the computation circuit 40, the comparator circuit 42 and the electronic circuits 30. It includes logic circuits and a clock circuit to prepare the sequential signals to control the computation circuit 40, the comparator 42, the registers 16A and 16B, and the electronic gates 30.

The sequencing circuit 32 receives a certain number of signals that are referenced ALE, ATD and IAE on conductors 84, 86 and 88 respectively. It gives control signals to the comparator circuit 42, the computation circuit 40 and the electronic circuits 30 on conductors 90, 92 and 94.

The signal ALE is a signal for the validation of the addressing code, the signal ATD is a signal indicating that the addressing code has just been changed and the signal IAE is a signal indicating the identity or non-identity of the contents of the registers 16A and 16B.

The computation circuit 40 performs the predictive function so as to determine the next addressing code from the previous addressing code contained in the address register 16A. This function corresponds to the one chosen by the programmer during the programming of the central processing unit 18. This function or law of prediction has the effect wherein the pieces of data used for the processing are not recorded in consecutive addresses of the memory but in addresses which, seen from the exterior, have no logic relationship between themselves, the law of prediction being unknown to the observer.

The sequencing of the read operations or steps shall now be described with reference to FIGS. 1 and 2.

At the instant T0, the signal ATD (diamond 50) called a "address transition detection" signal starts the read cycle. At the instant (T0+10 ns), the first addressing code coming from the central processing unit 18 through the input/output circuits 20 is recorded in the external address register 16A (rectangle 52). This first addressing code is compared by the comparator circuit 42 with the code contained in the internal address register 16B (diamond 54).

Since it is the beginning of the cycle, the code contained in the register 16B includes, for example, only digits "0" so that the comparison indicates absence of identity. This absence of identity leads the sequencing circuit, at the time (T0+20 ns), to give a signal for the recording of the first addressing code in the internal address register 16B (rectangle 56). At the time (T0+40 ns), the first addressing code selects the memory 10 (rectangle 58). At the time (T0+60 ns), the reading of the memory is done (rectangle 60). At the time (T0+70 ns), the signals read in the memory are recorded in binary form in the read register 26 (rectangle 62). At the time (T0+80 ns), the transfer of the contents of the read register 26 to the data register is done through the electronic transfer gates 30 (rectangle 64). At the time (T0+100 ns), the piece of data contained in the data register 28 is transferred to the central processing unit 18 through the input/output circuit 20 (rectangle 66) under the control of a signal OE (FIG. 1).

As soon as the piece of data is recorded in the read register 26 at the time (T0+70 ns), the contents of the internal register 16B may be modified for the recording, at the time (T0+80 ns), of the second addressing code computed by the computation circuit 40 (rectangle 68). At the time (T0+100 ns), the second addressing code selects the corresponding memory cells (rectangle 70). At the time (T0+120 ns), the selected memory cells are read (rectangle 72) and the signals read are recorded in binary form in the read register at the time (T0+13 ns) (rectangle 74). As soon as this recording has been done, the memory is ready for the new cycle (ellipse 76), which starts with the recording, in the external address register 16A, of the second addressing code coming from the central processing unit 18 through the input/output circuit 20 (diamond 50 and rectangle 52). This second addressing code, which is given by the central processing unit, is compared with the second addressing code as computed (rectangle 68) by the computation circuit 40.

If there is no identity, the steps are those described here above.

If there is identity, which is then the most probable case, the transfer of the contents of the read register 26 to the data register 28 is done at the time (T0+20 ns) (rectangle 78) of the second cycle in progress, these contents corresponding to those recorded at the time (T0+130 ns) (rectangle 74) of the first cycle, namely the previous cycle. The transfer of the piece of data to the central processing unit is done at the time (T0+40 ns) through the input/output circuit 20 (rectangle 80) under the control of the signal OE (FIG. 1).

Simultaneously, the operations defined by the rectangles 68, 70, 72 and 74 are performed on the basis of the second addressing code given by the central processing unit 18, enabling the recording, at the time (T0+60 ns) of this second cycle, of the contents of the memory cells selected by a third addressing code as computed by the computation circuit 40.

In FIG. 2, the comparison of the successive times shows that it is necessary to have a period of 100 ns to output a piece of data from the memory 10 in the case of a prior art reading mode. This period is reduced to 40 ns in the read mode according the invention if the consecutive addresses result from the application of the prediction function.

The operation that has just been described shows that if a fraudulent individual introduces an addressing code that does not obey the prediction function, this inaccurate code leads to the output of a false piece of data by the operations 56 to 66. Furthermore, the addressing codes that will be computed, in this case, by the operations 68 to 74 will not correspond to the addressing codes that will be given by the fraudulent individual for the following part of the operations. As a result, the codes of the fraudulent individual can be processed only according to the operations 56 to 66, which will lead to the output of false data.

Since the prediction function is contained only in the addressing circuits of the memory, the fraudulent individual cannot determine this fact by testing the memory in a routine manner.

The above description of the method and device are used to define a method for the reading of the memory (10) comprising first of all the following steps:

a) selecting a prediction function determining an addressing code of the memory on the basis of the previous addressing coding, and b) preparing programs of instructions in taking account of the prediction function chosen at the step a) to define the successive addressing codes.

For the reading of the memory 10, these first two steps a) and b) lead to the following steps:

k) applying an addressing code to the addressing circuits of the memory by the central processing unit;

m) reading the memory at the address defined by the addressing code of step k);

n) recording the signals read in a first register called a read register and then in a second register called a data register;

o) computing the next addressing code, on the basis of the previous addressing code, by applying the prediction function defined by step a);

p) reading the memory at the address computed by the step o) and the transfer of the contents of the data register to the central processing unit;

q) applying the next addressing code to the addressing circuits of the memory by the central processing unit;

r) comparing the computed addressing code with the addressing code given by the central processing unit:

1) if there is identity of the compared codes transferring the contents of the data register to the central processing unit, and then returning to step o);

2) if there is no identity of the compared codes, returning to step m).

A method of this kind for the reading of the memory 10 according to the operations k) to r) leads to the use of two is registers 26 and 28 during the reading but provides a gain in time and hence a higher average reading speed.

If the aspect of gain and speed is not of vital importance, the read method may be simplified and may then include the following steps:

c) transferring an addressing code from the central processing unit 18 to the first address register 16A of the addressing circuits 48 of the memory 10;

d) comparing the addressing code contained in the first address register 16A with the code contained in the second address register 16B;

e) reading the memory 10 at the address contained in the first address register 16A if there is no identity of the compared codes;

f) reading the memory 10 at the address contained in the second address register 16B if there is identity of the compared codes;

g) computing the next addressing code on the basis of the previous addressing code by applying the prediction function defined in step a);

h) recording the addressing code computed by step g) in the second addressing register 16B; and i) returning to step c).

In this second simplified read mode, only one read register is necessary at the output of the memory (10).

Should a read register 26 and a data register 28 be planned, step o) for computing the addressing code may begin as soon as the signals read in the read register 26 are recorded, provided that the addressing code resulting from the computation is recorded in the address register 16B only after the transfer of the data read in the read register to the address register. In this case, the beginning of step o) gets inserted into step n) as soon as the signals read in the read register 26 are recorded.

The invention has been described with respect to a relatively simple prediction function in which the following addressing code is computed from the previous addressing code. It is clear that this prediction function may be more complicated with computed addressing code depending on several parameters, and especially on the values of several preceding addressing codes.

Having thus described at least one illustrative embodiment of the invention, various modifications and improvements will readily occur to those skilled in the art and are intended to be within the scope of the invention. Accordingly, the foregoing description is by way of example only and is not intended as limiting. The invention is limited only as defined in the following claims and the equivalents thereto.

What is claimed is:

1. A method for reading data of a memory of a central processing unit of a microcomputer with which there are associated circuits for addressing of cells of said memory, comprising a first address register to receive an addressing code from the central processing unit, and circuits for reading of signals read in the memory cells selected by said addressing circuits, comprising at least one read register in which there are recorded, in binary form, the signals read wherein said method comprises steps of:

a) selecting a prediction function determining an addressing code of the memory from at least one previous addressing code;

b) preparing programs of instructions based on the selected prediction function at step a) to define successive addressing codes;

c) applying said addressing code to the addressing circuits of the memory by the central processing unit;

d) reading the memory at the address defined by the addressing code of step c);

e) recording the signals read in a first register called a read register and then in a second register called a data register;

f) computing next addressing code based on the previous addressing code, by applying the prediction function defined by step a);

g) reading the memory at the address computed by step f) and transfer of the contents of the data register to the central processing unit;

h) applying the next addressing code to the addressing circuits of the memory by the central processing unit;

i) comparing the computed addressing code with the addressing code provided by the central processing unit:

1) if there is identity between the compared codes, transferring the contents of the data register to the central processing unit, and then returning to step f);

2) if there is no identity between the compared codes, returning to step d).

2. A method according to claim 1, wherein the step f) is performed after step e) upon the recording of the signals read in the read register.

3. A device for reading a memory having memory cells, said device comprising:

reading circuits for reading memory signals in the memory cells selected by an addressing circuit;

wherein said addressing circuit for addressing the memory cells comprising:

a first address register storing a previous address code;

a second address register storing a next address code;

a computing circuit coupled to the first and second address registers wherein the computing circuit computes the next address code from the previous address code;

a comparator circuit coupled to the first and second address registers wherein the comparator circuit compares the previous address code and the next address code;

a sequencing circuit coupled to the addressing circuit wherein the sequencing circuit provides sequential control signals to the addressing circuit; wherein each of the reading circuits comprises:

a first and second read register;

a transfer circuit that connects an output of the first read register to an input of the second read register;

wherein the transfer circuit receives a control signal provided by the sequencing circuit to transfer contents of the first read register into the second read register; and wherein the contents of the first read register are transferred when the second read register contains the next address code.

4. A computer system comprising:

a memory having memory cells;

a reading circuit for reading signals in the memory cells; and an addressing circuit for selecting said memory cells to be read; wherein the addressing circuit including:
- a first address register storing a previous address code;
- a second address register storing a next address code;
- a computing circuit coupled to the first and second address registers wherein the computing circuit computes the next address code from the previous address code;
- a comparator circuit coupled to the first and second address registers wherein the comparator circuit compares the previous address code and the next address code;
- a sequencing circuit coupled to the addressing circuits and providing sequential control signals to the addressing circuits;

wherein the reading circuit comprises:
- a first and second read register;
- a transfer circuit that connects an output of the first read register to an input of the second read register;

wherein the transfer circuit receives a control signal provided by the sequencing circuit to transfer contents of the first read register into the second read register; and wherein the contents of the first read register are transferred when the second read register contains the next address code.

5. A device for reading a memory comprising:

an addressing circuit coupled to memory inputs;

plurality of reading circuits coupled to memory outputs; and a sequencing circuit coupled to the addressing circuit, wherein the addressing circuit includes:
- a first address register storing a previous address code;
- a second address register storing a next address code;
- a computing circuit coupled to the first and second address registers wherein the computing circuit computes the next address code from the previous address code; wherein the addressing circuit further including a comparator circuit coupled to the first and second address registers;

wherein each of the reading circuits comprises:
- a first and second read register; and
- transfer circuit that connects an output of the first read register to an input of the second read register;

wherein the transfer circuit receives a control signal provided by the sequencing circuit to transfer contents of the first read register into the second read register; and wherein the contents of the first register are transferred when the second read register contains the next address code.

* * * * *